United States Patent [19]

Jun

[11] Patent Number: 5,508,218
[45] Date of Patent: Apr. 16, 1996

[54] METHOD FOR FABRICATING A SEMICONDUCTOR MEMORY

[75] Inventor: Young K. Jun, Seoul, Rep. of Korea

[73] Assignee: LG Semicon Co., Ltd., Seoul, Rep. of Korea

[21] Appl. No.: 174,388

[22] Filed: Dec. 28, 1993

[51] Int. Cl.$^6$ ............................................. H01L 21/8242
[52] U.S. Cl. ............................ 437/52; 437/47; 437/60; 437/229; 437/919
[58] Field of Search .................... 437/47, 48, 52, 437/60, 919, 44, 944, 235, 233, 229

[56] References Cited

U.S. PATENT DOCUMENTS

| | | | |
|---|---|---|---|
| 4,536,949 | 8/1985 | Takayama et al. | 437/195 |
| 5,063,176 | 11/1991 | Lee et al. | 437/195 |
| 5,155,675 | 10/1992 | Oehrlein et al. | |
| 5,268,322 | 12/1993 | Lee et al. | |
| 5,294,561 | 3/1994 | Tanigawa | 437/60 |
| 5,389,560 | 2/1995 | Ponki | 437/60 |

FOREIGN PATENT DOCUMENTS 0145870  6/1989  Japan .
0236630  9/1989  Japan .
4-116865  4/1992  Japan .

*Primary Examiner*—Tom Thomas
*Attorney, Agent, or Firm*—Morgan, Lewis & Bockius

[57] ABSTRACT

A method for fabricating a semiconductor memory, including the steps of: forming a memory cell transistor having a gate electrode, a source area and a drain area on a semiconductor substrate; forming an insulating film over the memory cell transistor; forming an etch preventing film over the insulating film; forming multi-layer films over the etch preventing film by stacking alternately a disposable film and a conduction layer; selectively etching the multi-layer films corresponding to a contact hole to form a stacked film pattern; forming conductive sidewalls on sides of the stacked film pattern; forming a photoresist pattern on the stacked film pattern; selectively etching the etch preventing film and the insulating film by using the photoresist pattern and the conductive sidewall, and thereby forming the contact hole; forming an upper conductive film on the stacked film pattern and the contact hole including the conductive sidewall; patterning the upper conductive film and the stacked film pattern to thereby form a capacitor storage node pattern; and removing the disposable film.

11 Claims, 8 Drawing Sheets

F I G. 3f
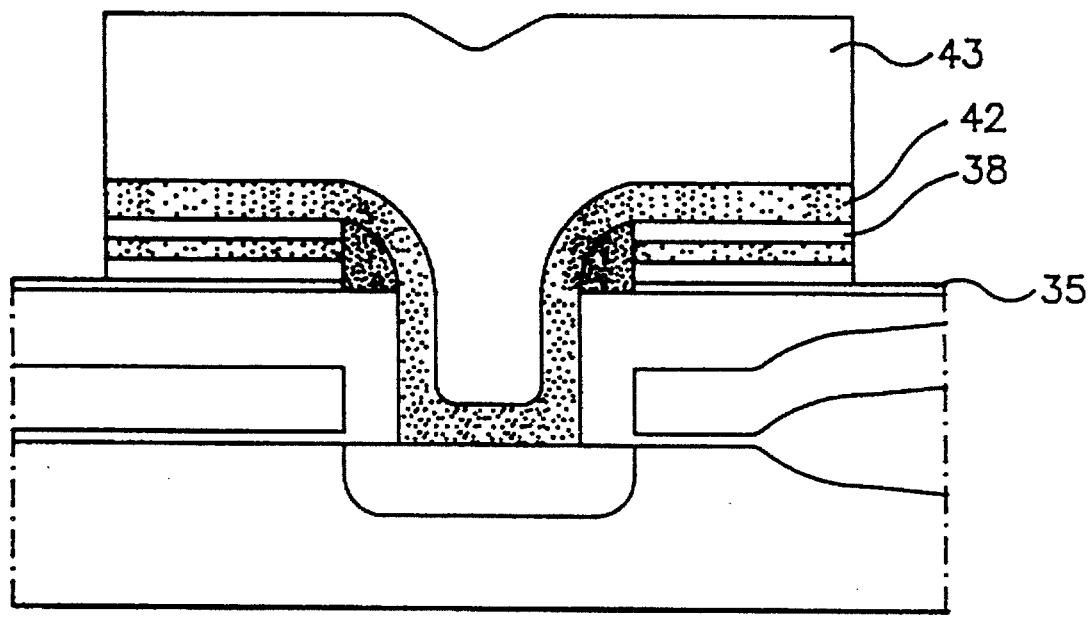
F I G. 3g
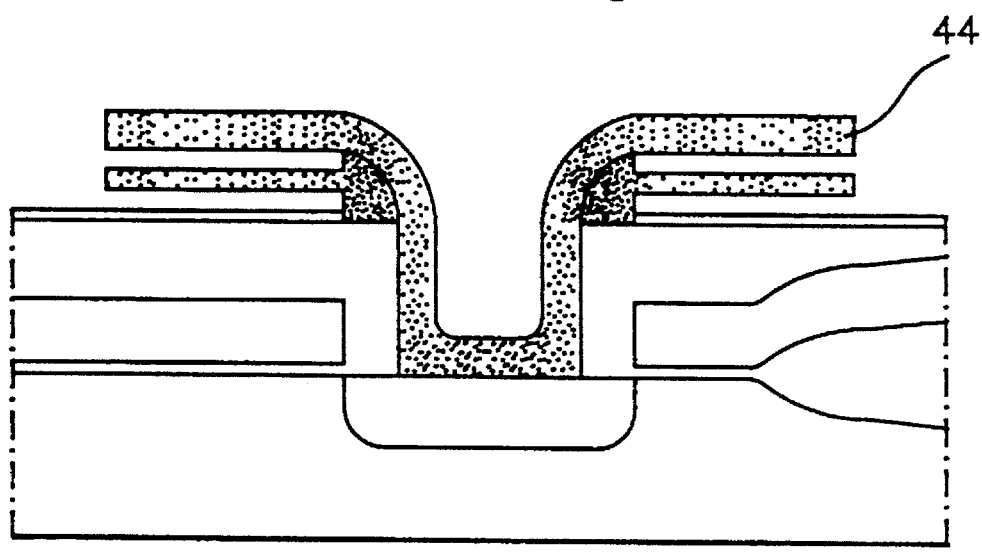

5,508,218

1

METHOD FOR FABRICATING A SEMICONDUCTOR MEMORY

FIELD OF THE INVENTION

This invention relates to a semiconductor memory having stacked storage node and a method of fabricating the same.

BACKGROUND OF THE INVENTION

Keeping pace with the development of semiconductor, efforts to integrate more elements onto one semiconductor chip in high degree has been actively progressing. Particularly, in DPAM (Dynamic Random Access Memory) cell, various Cell structures have been proposed to minimize the size of a element.

For high integration, it is preferable that a memory cell is composed of one transistor and one capacitor in a view to minimize the occupied area on a chip. In a memory cell composed of one transistor and one capacitor as mentioned before, a signal charge is stored in a storage node of a capacitor, which is connected to a transistor (switching transistor). Consequently, if the size of a memory cell is decreased for high integration of semiconductor memory, because the size of the capacitor has to be decreased accordingly, the number of charges which can be stored in a storage node have to also decrease.

Therefore, in order to transmit a desired signal without any malfunction, the capacitor storage node of a memory cell has to have a surface area greater than a certain predetermined value to secure a capacitor capacity required for the transmission of a signal.

Thus, a capacitor storage node has to have relatively large area within the limited area of a semiconductor substrate to decrease the size of a memory cell.

Of the various memory cell construction proposed to increase the surface area of a capacitor storage node, a stack capacitor is a capacitor structure having the advantages of being favorable for high integration while being influenced by soft error little.

Further a memory cell having stacked capacitor also has the advantages of being suitable for mass production with a relatively simple process.

Finned capacitor published in "IDEM pp. 592–295, 1988" by Ema et al., one of the stacked capacitor to increase the capacity, is to be explained hereinafter, referring to FIGS. 1(a) to 1(g).

First, as shown in FIG. 1(a), after forming a memory cell transistor composed of gate pole 1 and source and drain 2 on a semiconductor substrate 100, deposit a nitride film 3 above the memory cell transistor as shown in FIG. 1(b), then form a first oxide film 4, a first poly silicon layer 5, a second oxide film 6 successively thereon as shown in FIG. 1(c), and etch the second oxide film 6, the first poly silicon layer 5, and the first oxide film 4 selectively thereafter to form a contact hole as shown in FIG. 1(c).

Next, as shown in FIG. 1(d), after deposition of a second poly silicon layer on all over the surface of above resultant, carry out a selective etching of the second poly silicon layer 7, the second oxide film 6, and the first poly silicon layer 5, to form a finned capacitor storage node as shown in FIG. 1(e).

Next, as shown in FIG. 1(f), after removing the second oxide film and the first oxide film with a wet etching, form a capacitor dielectric film 8 on all over the capacitor storage node having been formed in above process as shown in FIG.

2

1(g), then form a capacitor plate pole 9 on all over the capacitor dielectric film 8 completing a capacitor of a semiconductor memory.

In a capacitor having a finned storage node described above, the more the number of stacked fins increase, the greater the possibility of defect development, due to weakening of the mechanical strength of the poly silicon layer in the center part connected with each stacked layer and serving to support the stacked layers.

And, because the more the number of stacked fins increase, the greater the aspect ratio of a contact hole which is provided to connect a memory cell transistor with a capacitor become, the coating property of the poly silicon supporting film which is the uppermost conduction layer forming stacked capacitor storage node is impaired.

To solve these problems, H. Gotou et al. invented a technology in which stacked films are provided to be able to be supported by a conductive side wall connecting fin shape stacked films in one corner of a conductive base layer connected to a source and drain of a memory cell transistor (U.S. Pat. No. 5,126,810).

Forgoing technology is to be explained hereinafter, referring to FIGS. 2(a) to 2(f).

First, as shown in FIG. 2(a), after forming a memory cell transistor composed of gate pole 11 and source and drain area 12 on a semiconductor substrate 100 by a general MOS transistor production process, form inter-layer insulation film 13, etch preventing film 14 and buffer layer 15 successively with CVD (Chemical Vapor Deposition) method on all over the substrate on which the memory cell transistor has been formed.

Then, etch the buffer layer 15, etch preventing film 14 and the inter-layer insulation film 13 selectively to form a contact hole exposing source(or drain) area 12 of the transistor, and carry out stacking of multi-layer poly silicon layers 16, 18 and 20 and multi-layer oxide films 17, 19 and 21 alternatively thereafter.

Next, as shown in FIG. 2(b), form a desired pattern by selective etching of the alternatively stacked multi-layer poly silicon layers 16, 18 and 20 and the multi-layer oxide films 17, 19 and 21.

Next, as shown in FIG. 2(c), after deposition of poly silicon on all over the surface of above resultant, form a poly silicon side wall 22 with anisotropic etching. The poly silicon side wall 22 formed as above supports the multi-layer poly silicon layers 16, 18 and 20 stacked between the multi-layer oxide films 17, 19 and 21 as well as acts as a electric communication passage.

Next, as shown in FIG. 2(d), after deposition of photo resist 23 on all over the surface of above resultant, carry out patterning with a photo etching process to expose one side of the formed poly silicon side wall 22, and carry out etching of the exposed one side poly silicon side wall 22 thereafter.

Next, as shown in FIG. 2(e), after removing the photo resist pattern and the buffer layer, the multi-layer oxide films 17, 19 and 21 are removed so as to complete a capacitor storage node composed of multi-layer poly silicon layers 16, 18 and 20 and poly silicon side wall 22 supporting the multi-layer poly silicon layers 16, 18 and 20.

Next, as shown in FIG. 2(f), after forming capacitor dielectric film 24 on all over the capacitor storage node, carry out deposition and patterning of a conductive material on all over the surface of the dielectric film 24 to form a capacitor plate pole 26 completing a capacitor.

The prior art described above has, because load is concentrated on the side wall of the conductive base layer(poly silicon layer 16) above the contact hole provided for connecting the transistor and the capacitor, a tendency that mechanical strength of the stacked storage node become weak, and difficulties in the processes that the degree of etching in the anisotropic etching for forming the poly silicon side wall has to be controlled precisely to prevent the stacked film above from being etched.

SUMMARY OF THE INVENTION

The object of this invention to solve aforementioned problems is to provide a stacked capacitor storage node having an improved mechanical strength and the coating property of the step of the uppermost conduction layer of the stack.

This and other object and the features of this invention can be achieved by providing a semiconductor memory comprising a semiconductor substrate; a memory cell transistor having gate pole and source and drain area formed on the semiconductor substrate; a capacitor storage node having an insulation film formed over the memory cell having a contact hole exposing a certain part of the source and drain area of the memory cell transistor; and a conductive side wall formed on the insulation film of the edge part on the upper part of the contact hole, multi-layer conductive stacked films horizontally extended to outer side of the contact hole and connected with one side of the conductive side wall, and an upper conduction layer formed along the inside surface of the contact hole and the conductive side wall to be connected to the source and drain of the transistor, and a method for fabricating a semiconductor memory, comprising steps for forming a memory cell transistor having gate pole and source and drain area on the semiconductor substrate; forming an insulation film over the memory cell transistor; forming an etch preventing film over the insulation film; forming multi-layer stacked films by stacking a disposable films and conduction layers alternatively over the etch preventing film; forming a desired stacked film pattern by etching the formed stacked films selectively; forming conductive side walls on the sides of the stacked film pattern; carrying out selective etching of the insulation film using the conductive side walls as masks so as to expose the source and drain area of the memory cell transistor forming a contact hole; forming upper conduction film on the inside surface of the formed contact hole, the conduction side walls and the stacked films; patterning the upper conduction film and the stacked films with the capacitor storage node pattern; and removing the disposable films among the stacked films.

Another definition of the subject invention is a method of fabricating a semiconductor memory which includes the following steps:

(a) forming a memory cell transistor having a gate electrode, a source area and a drain area on a semiconductor substrate;

(b) forming an insulating film over the memory cell transistor;

(c) forming an etch preventing film over the insulating film;

(d) forming multi-layer films over the etch preventing film by stacking alternately a disposable film and a conduction layer;

(e) selectively etching the multi-layer films corresponding to a contact hole to form a stacked film pattern;

(f) forming conductive sidewalls on sides of the stacked film pattern;

(g) forming a photoresist pattern on the stacked film pattern;

(h) selectively etching the etch preventing film and the insulating film by using the photoresist pattern and the conductive sidewall, and thereby forming the contact hole;

(i) forming an upper conductive film on the stacked film pattern and the contact hole including the conductive sidewall;

(j) patterning the upper conductive film and the stacked film pattern to thereby form a capacitor storage node pattern; and (k) removing the disposable film.

BRIEF DESCRIPTION OF THE DRAWINGS

FIGS. 3(a) to 3(g) show processes of a method for fabricating a capacitor of a semiconductor memory in accordance with one embodiment of this invention.

DETAILED DESCRIPTION OF THE INVENTION

The detail of this invention is to be explained hereinafter, referring to the attached drawings.

Figure 4:
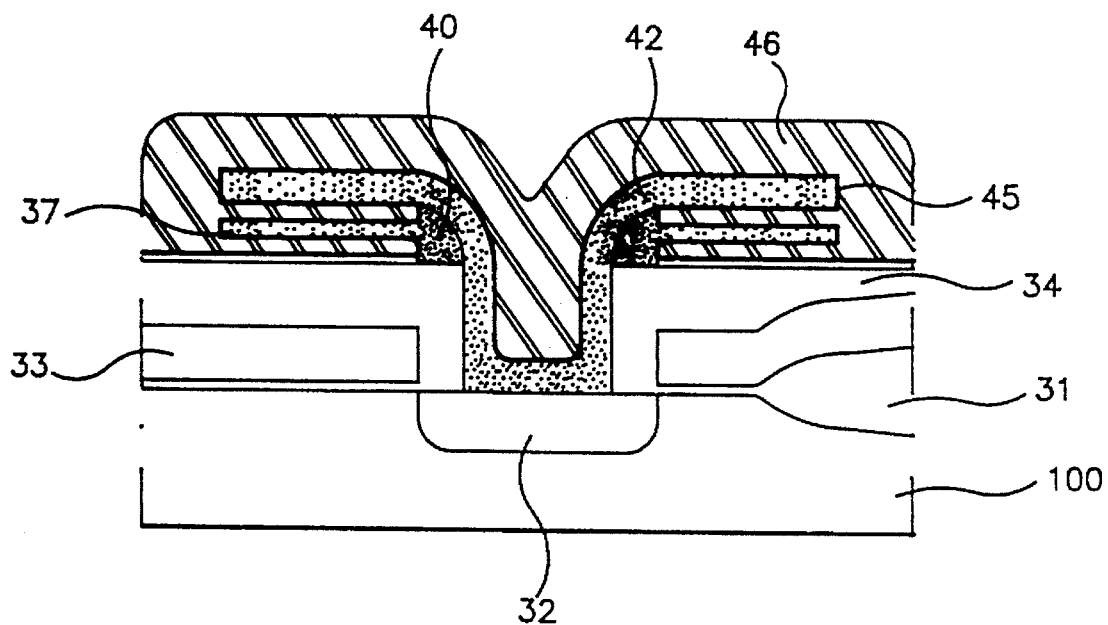
FIG. 4 is a sectional drawing of a capacitor of a semiconductor memory in accordance with one embodiment of this invention.

A stacked capacitor of a semiconductor memory in accordance with one embodiment of this invention is shown in FIG. 4.

The semiconductor memory in accordance with one embodiment of this invention includes, as shown in FIG. 4, a contact hole formed over a source(or drain) area 32 for electrical connection of a capacitor and a memory cell transistor, an insulation film 34 over the memory cell transistor, conductive side wall 40 formed above the edge part of the insulation film 34 in the upper part of the contact hole, a conduction layer 37 horizontally extended to outer side of the contact hole and connected to one side of the conductive side wall, and an upper conduction film 42 formed along the inside of the contact hole and the conductive side wall and connected to the source (or drain) of the transistor, whereby the conductive side wall 40, the conduction layer 37, and the upper conduction film 42 form a storage node.

The conduction layer 37 connected to one side of the conduction layer side wall can be formed in multi-layer to increase the capacity of the capacitor, though it is shown in single layer in the embodiment shown in FIG. 4.

As seen above, the capacitor storage node of a semiconductor memory in accordance with this invention can improve the mechanical strength of the storage node part around the contact hole where the load of the stacked films is concentrated by providing the conductive side wall 40 and the upper conduction film 42 to support the conductive stacked films.

The method of fabricating a semiconductor memory in accordance with one embodiment of this invention to be explained hereinafter, referring to FIGS. 3(a) to 3(g).

Figure 1A:
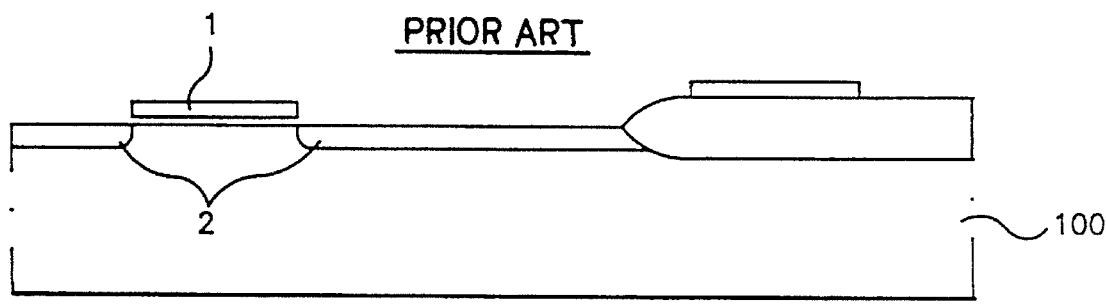
FIGS. 1(a) to 1(g) shows conventional processes of a method for fabricating a capacitor of a semiconductor memory.
Figure 1B:
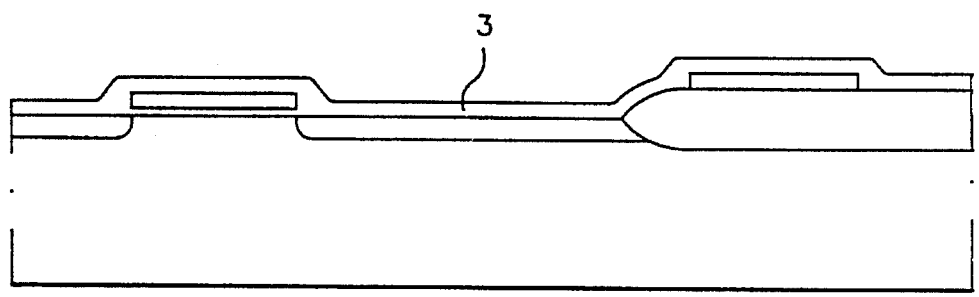
Figure 1C:
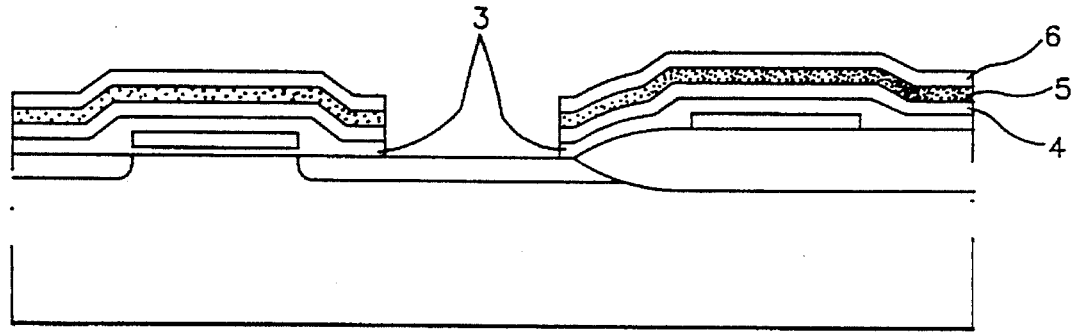
Figure 1D:
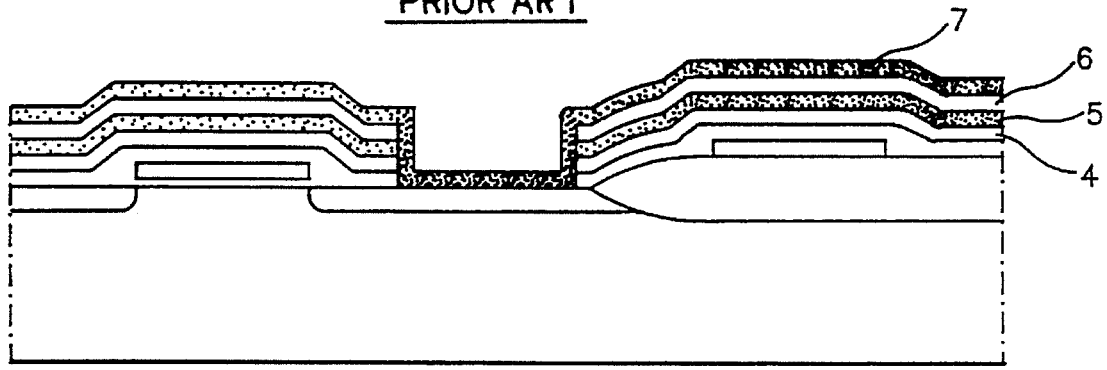
Figure 1E:
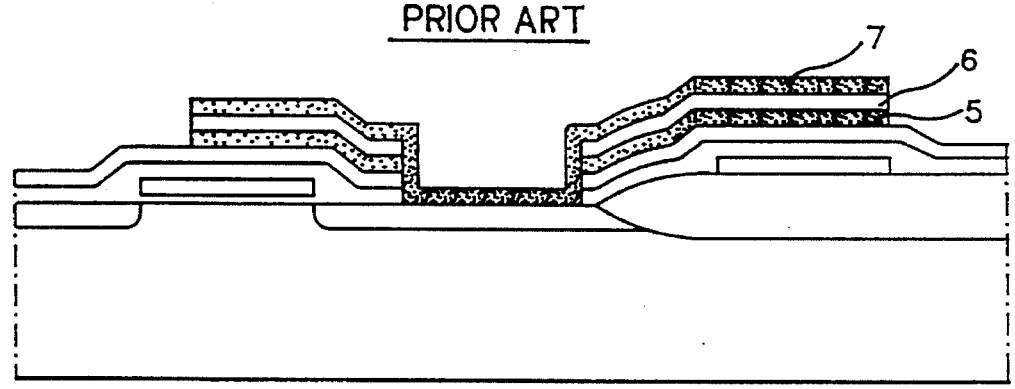
Figure 1F:
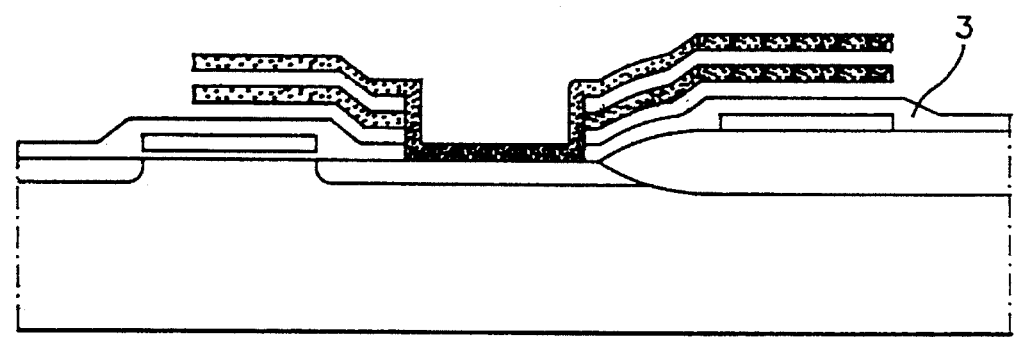
Figure 1G:
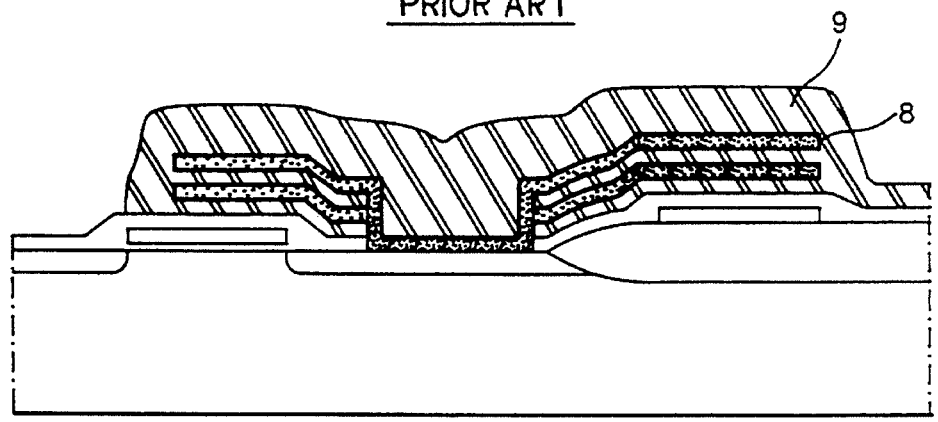
Figure 2A:
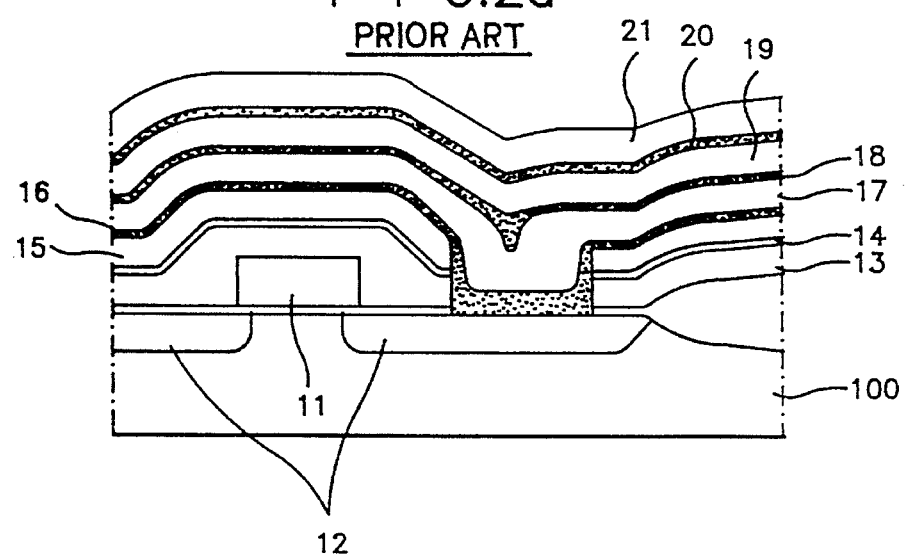
FIGS. 2(a) to 2(f) shows another conventional processes of a method for fabricating a capacitor of a semiconductor memory.
Figure 2B:
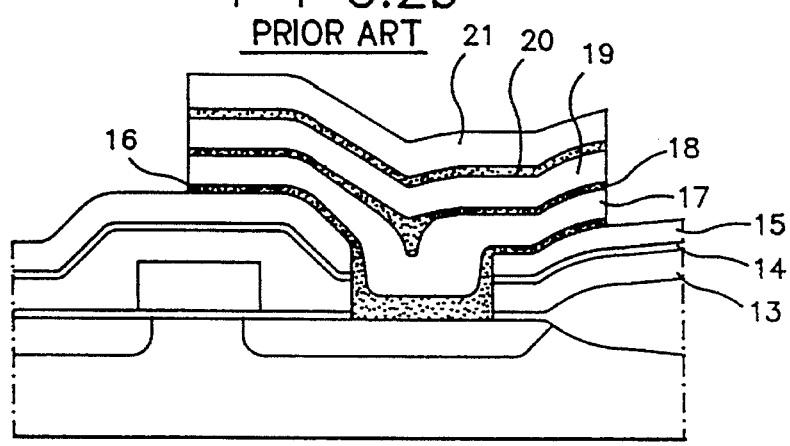
Figure 2C:
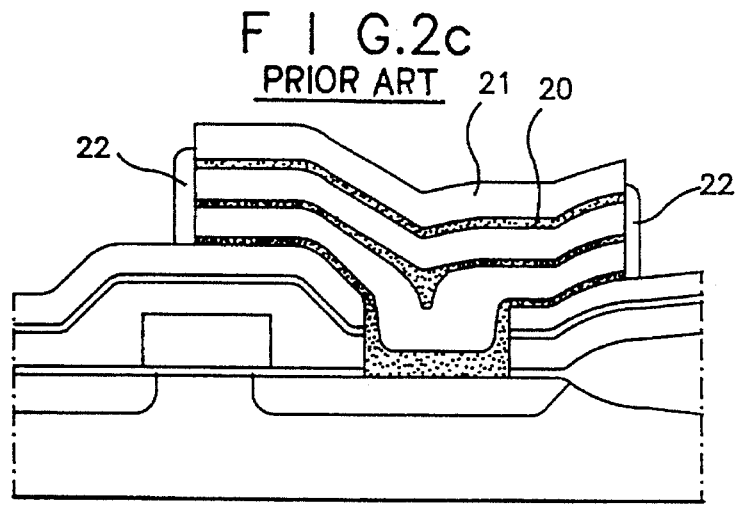
Figure 2D:
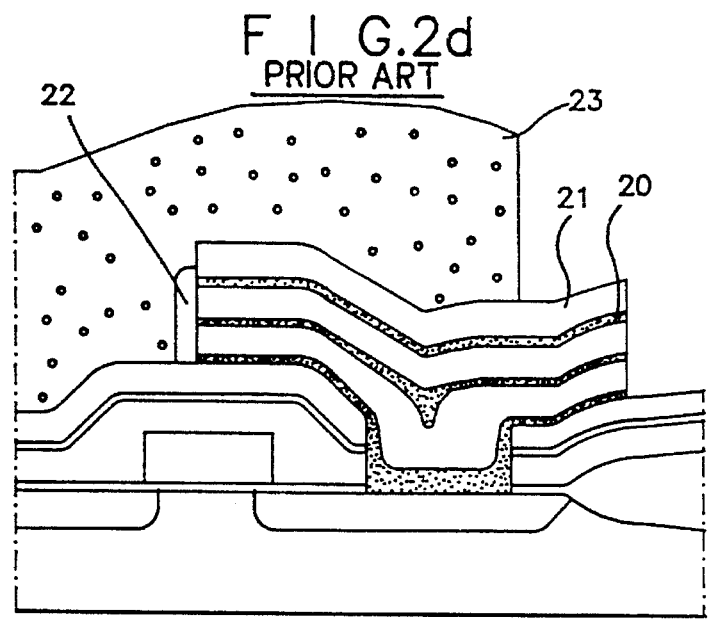
Figure 2E:
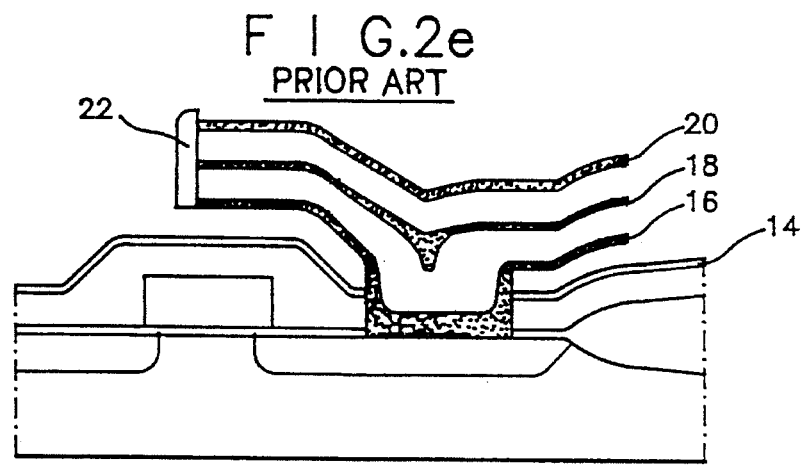
Figure 2F:
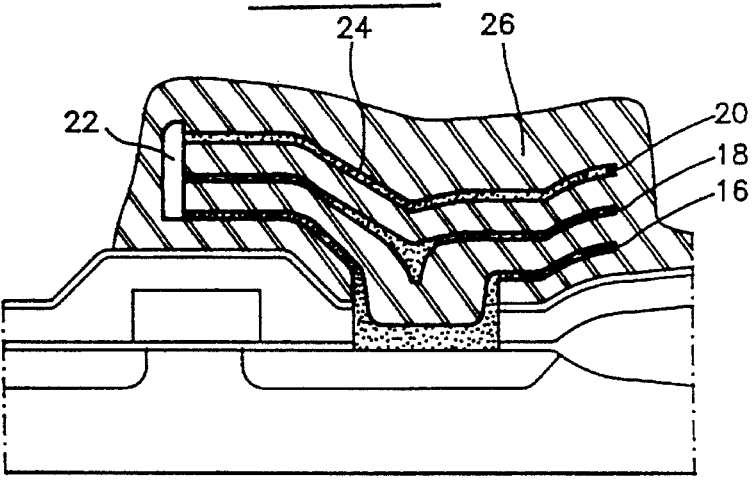
Figure 3A:
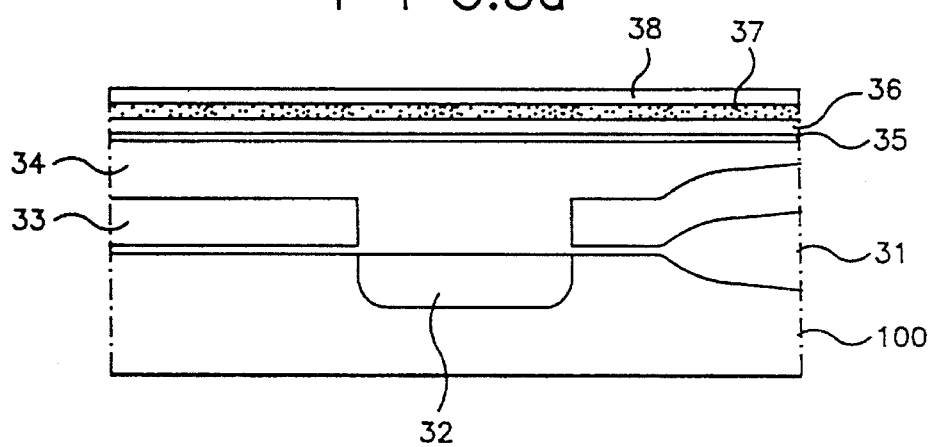

First, as shown in FIG. 3(a), provide a transistor by forming gate pole 33, and source and drain area 32 through general MOS transistor fabrication process on a semiconductor substrate 100 divided into an active region and a field region by a field oxide film 31.

Then, after forming, for example an oxide film as a first insulation film 34 over the semiconductor substrate on which the transistor has been formed, form etch preventing film 35, a first disposable film 36, a first conduction layer 37 and a second disposable film 38 thereon successively.

As for the etch preventing film 35, a nitride film, for example, is formed to a thickness of 500 to 1000 angstroms with LPCVD(Low Pressure Chemical Vapor Deposition) method or PECVD(Plasma Enhanced Chemical Vapor Deposition) method, and as for the first and the second disposable films 36 and 38, an organic insulation film of polyimide and the like or an inorganic insulation film of SOG(Spin On Glass) or silicon oxide film etc., are used. The organic insulation film or the SOG is formed with spin coating method, and the inorganic insulation film is formed by a CVD method. Each of the first and the second disposable films 36 and 38 is formed to a thickness of 500 to 1500 angstroms.

The first conduction film 37 is a silicon film of an amorphous silicon film or a poly silicon film etc formed to a thickness of 500 to 1500 angstroms at a temperature of 540 to 620 degrees C. by LPCVD method using mixture gas of SiH4 or Si2H6 with PH3.

Though the stacked disposable films 36 and 38 and the conduction film 37 is formed with single conduction film in one embodiment of this invention, it is also possible to stack in multi-layers, and can have the greater capacitor capacity if stacked more.

Figure 3B:
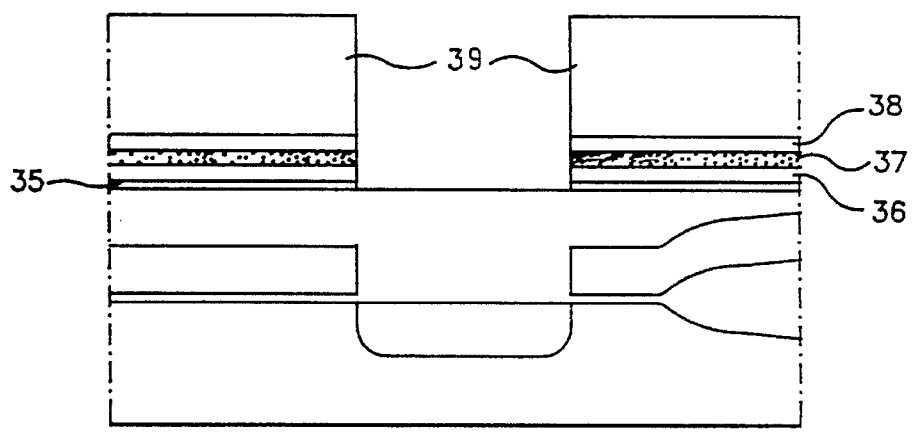

Next, as shown in FIG. 3(b), after deposition of photo resist on the second disposable film 38, carry out patterning with a general photo etching process to form a predetermined photo resist pattern 39. Using the photo resist pattern 39 formed through foregoing process as a mask, carry out etching to remove the second disposable film, the first conduction film 37, the first disposable film 36 and the etch preventing film 35 successively, when the etching can be carried out with those methods, for example RIE(Reactive Ion Etching) method using gases containing F such as CF4 or CHF3, or Cl such as HCl or Cl2.

Figure 3C:
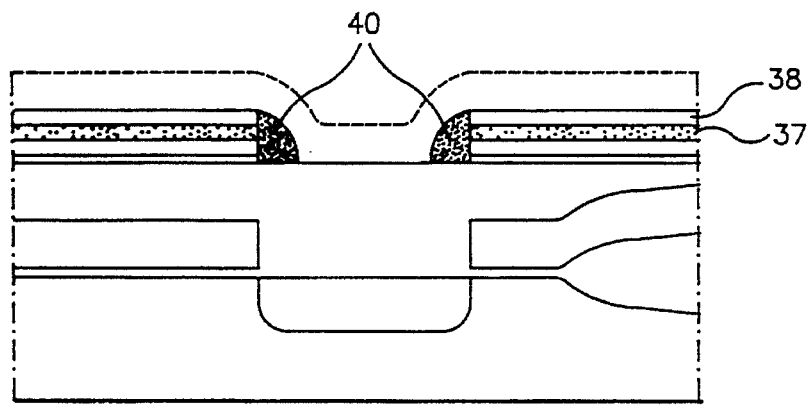

Next, as shown in FIG. 3(c), after removing the photo resist pattern, form a conductive silicon film to a thickness of 200 to 2000 angstroms at 540 to 620 degrees C. with LPCVD method on all over the surface of above resultant, and carry out etch back to form a conductive side wall 40 on the side of the stacked film.

Figure 3D:
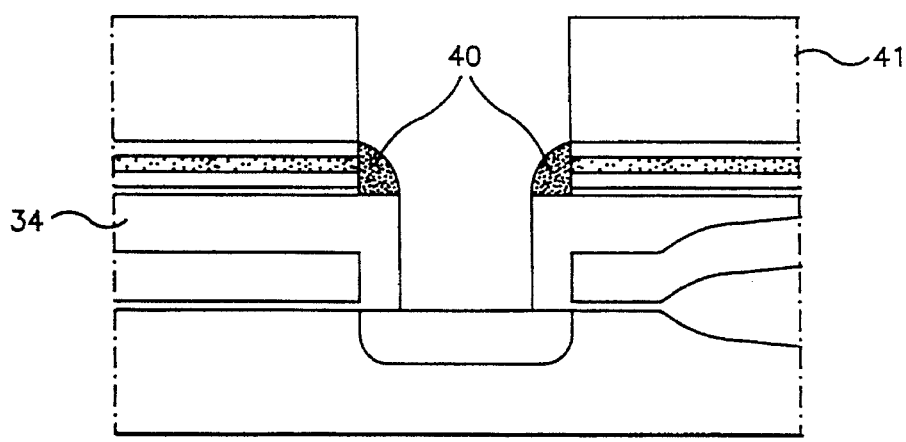

Next, as shown in FIG. 3(d), form a photo resist pattern 41 again utilizing the mask used in FIG. 3(b), and carry out a selective etching of the oxide film which is the first insulation film 34 using the photo resist pattern and above conductive side wall 40 as a mask to form a contact hole exposing the source(or drain) area of the transistor, when the second disposable film 38 which is the uppermost film of the stacked film is a kind of oxide film such as SOG or CVD oxide film, the contact hole can be formed by forming a photo resist pattern as described above and carrying out etching of the oxide film utilizing the photo resist pattern and the conductive side wall as a mask, but when the second disposable film 38 is an organic insulation film, the etching of the oxide film 34 may be carried out using the conductive side film 40 as a mask without forming the photo resist pattern.

In the meantime, as another embodiment of this invention, it is also possible to form the uppermost layer of the stack of the disposable films and conduction layers to be a conduction layer, in which case the contact hole can be formed by carrying out of a selective etching of the first insulation film 34 utilizing the conduction layer at the uppermost layer of the stack and the conductive side wall as a mask without any necessity of separate photo resist mask in forming of the contact hole.

Figure 3E:
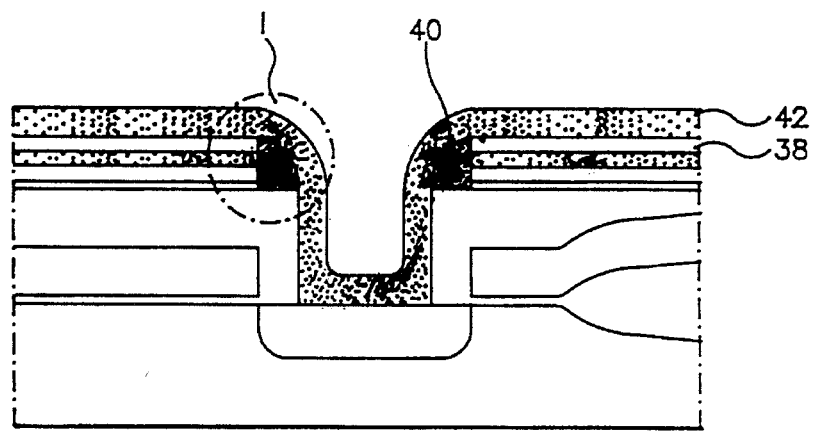

Next, as shown in FIG. 3(e), electrically connect the conductive side wall 40 with the source(or drain) 32 of the memory cell transistor by forming a conductive silicon film to a thickness of 500 to 1500 angstroms as a second conduction film 42 on all over the resultant of the formed contact hole.

Next, as shown in FIG. 3(f), expose the first disposable film 36 by carrying out an selective etching up to the second conduction layer 42, the second disposable film 38 and the first conduction layer utilizing the photo resist pattern 43 formed by patterning using a mask for forming of the designated capacitor storage node pattern. Next, as shown in FIG. 3(g), form a capacitor storage node 44 having the first conduction layer 37, the conductive side wall 40 and the second conduction layer 40 by removing the second disposable film and the first disposable film with wet etching after removing the photo resist pattern, when the disposable films can be removed by wet etching using solutions containing F such as HF in case the disposable films are a kind of oxide film and using developer or mixture of hydrazide hydrate and polyamine when the disposable films are a kind of organic insulation film.

Then, after forming, for example, stacked films of silicon nitride films and oxide films as a capacitor dielectric film 45 on all over the surface of the stacked capacitor storage nodesformed as above, on all over which surface, deposit a conductive silicon film to a thickness of about 2000 angstroms at 540 to 620 degrees C. with LPCVD method to form a capacitor plate pole 46, completing a capacitor of a semiconductor memory.

As described in detail hereinbefore, this invention allows an improvement of the mechanical strength of the conduction layer around the contact hole on which the load of the stacked film concentrates by supporting the conductive stacked film of the capacitor storage node with the conductive side wall and the upper conduction film connected to this conductive side wall, as well as the improvement of the coating property of the upper conduction film by improving the aspect ratio of the contact hole through the conductive side wall.

Figure 5:
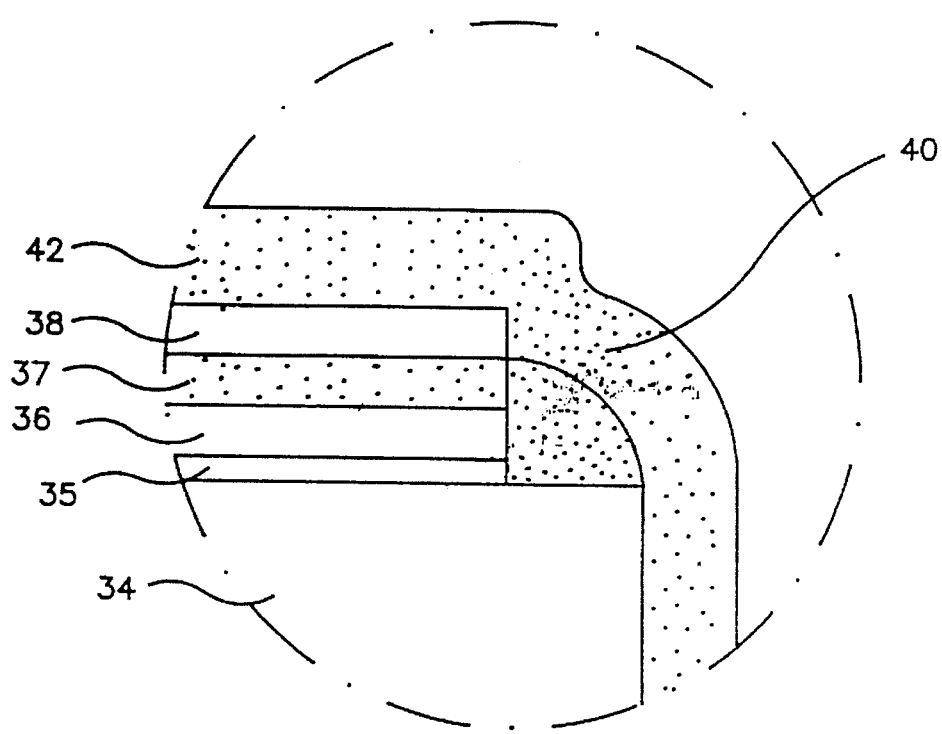
FIG. 5 is an enlarged view of a part of the processes in FIG. 3(e).

Moreover, as can be seen in FIG. 5 which is an enlarged view of part I of FIG. 3(e), even though a vertical misalignment should develop between the upper disposable film(the second disposable film) and the conductive side wall by an excessive etch back on forming the conductive side wall, as those are connected by the upper conduction film, securing allowance in the production process, the production is easy.

What is claimed is:

1. A method for fabricating a semiconductor memory, comprising the steps of:

(a) forming a memory cell transistor having a gate electrode, a source area and a drain area on a semiconductor substrate;

(b) forming an insulating film over the memory cell transistor;

(c) forming an etch preventing film over the insulating film;

(d) forming multi-layer films over the etch preventing film by stacking alternately a disposable film and a conduction layer:

(e) selectively etching the multi-layer films corresponding to a contact hole to form a stacked film pattern:

(f) forming conductive sidewalls on sides of the stacked film pattern;

(g) forming a photoresist pattern on the stacked film pattern;

(h) selectively etching the etch preventing film and the insulating film by using the photoresist pattern and the conductive sidewall, thereby forming the contact hole;

(i) forming an upper conductive film on the stacked film pattern and the contact hole including the conductive sidewall;

(j) patterning the upper conductive film and the stacked film pattern to thereby form a capacitor storage node pattern; and (k) removing the disposable film.

2. A method as claimed in claim 1, wherein the etch preventing film comprises a nitride film.

3. A method as claimed in claim 1, wherein the disposable film is formed of an organic insulation film or an inorganic film.

4. A method as claimed in claim 3, wherein the organic insulation film is polyamide film and the inorganic film is SOG or oxide film.

5. A method as claimed in claim 1, wherein the conduction layer is formed of conductive amorphous silicon or conductive polysilicon.

6. A method as claimed in claim 1, wherein the conductive sidewall is formed by a process of forming a conductive film all over the surface of the semiconductor substrate on which the stacked film pattern has been formed and thereafter carrying out etch back on the conductive film.

7. A method as claimed in claim 1, further comprising after step (k), forming a capacitor dielectric film all over the surface of the resultant structure and forming a capacitor plate electrode all over the surface of the capacitor dielectric film.

8. A method as claimed in claim 1, wherein said stacking step of step (d) includes the uppermost layer of the stacked films which is formed by stacking alternately the disposable film and the conductive film being a disposable film.

9. A method as claimed in claim 1, wherein the stacking step of step (d) includes the uppermost layer of the stacked films which is formed by stacking alternately the disposable film and the conductive film being a conduction film.

10. A method as claimed in claim 1, wherein the top film layer of the multi-layer films is a disposable film.

11. A method as claimed in claim 1, wherein the top film layer of the multi-layer films is a conduction film.

* * * * *